United States Patent
Hsieh et al.

(10) Patent No.: US 9,176,479 B2
(45) Date of Patent: Nov. 3, 2015

(54) TUNABLE DELAY CELLS FOR TIME-TO-DIGITAL CONVERTER

(71) Applicant: Taiwan Semiconductor Manufacturing Co., Ltd., Hsin-Chu (TW)

(72) Inventors: Hsieh-Hung Hsieh, Taipei (TW); Yen-Jen Chen, Taipei (TW); Chewn-Pu Jou, Chutung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1 day.

(21) Appl. No.: 14/161,714

(22) Filed: Jan. 23, 2014

(65) Prior Publication Data

US 2015/0205267 A1     Jul. 23, 2015

(51) Int. Cl.
| | |
|---|---|
| *H03M 1/50* | (2006.01) |
| *G04F 10/00* | (2006.01) |
| *H03L 7/085* | (2006.01) |
| *H03K 5/159* | (2006.01) |
| *G04F 10/10* | (2006.01) |

(52) U.S. Cl.
CPC ............ *G04F 10/005* (2013.01); *G04F 10/105* (2013.01); *H03K 5/159* (2013.01); *H03L 7/085* (2013.01); *H03M 1/50* (2013.01)

(58) Field of Classification Search
CPC ..... G04F 10/005; G04F 10/105; H03K 5/159; H03L 7/085; H03M 1/50
USPC .................................................. 341/144, 166
See application file for complete search history.

(56) References Cited

U.S. PATENT DOCUMENTS

| | | | | |
|---|---|---|---|---|
| 7,688,126 | B2 * | 3/2010 | Henzler et al. | 327/261 |
| 8,847,284 | B2 * | 9/2014 | Yang et al. | 257/207 |
| 8,878,613 | B2 * | 11/2014 | Wang et al. | 331/25 |
| 8,963,600 | B2 * | 2/2015 | Mann | 327/276 |
| 8,976,053 | B1 * | 3/2015 | Zhang et al. | 341/155 |

OTHER PUBLICATIONS

Dudek, P. et al., "A high-resolution CMOS time-to-digital converter utilizing a Vernier delay line", IEEE Journal of Solid-State Circuits, Feb. 2000, 35(2):240-247.

* cited by examiner

*Primary Examiner* — Brian Young
(74) *Attorney, Agent, or Firm* — Duane Morris LLP

(57) ABSTRACT

A time-to-digital converter (TDC) comprises a first delay line including a plurality of first delay cells connected in series, wherein each of the first delay cells include a plurality of first delay units connected in series, wherein each of the first delay units includes a tunable PMOS transistor, a first poly on oxide definition (OD) edge (PODE) transistor, and a pull-up PMOS transistor. The TDC further comprises a second delay line including a plurality of second delay cells connected in series, wherein each of the second delay cells include a plurality of second delay units connected in series, wherein each of the second delay units includes a tunable NMOS transistor, a second PODE transistor, and a pull-down NMOS transistor.

18 Claims, 5 Drawing Sheets

TUNABLE DELAY CELLS FOR TIME-TO-DIGITAL CONVERTER

FIELD OF DISCLOSURE

The disclosed systems and methods relate to semiconductor devices. More particularly, the disclosed devices and methods relate to time-to-digital convertor for all-digital phase-locked loop.

BACKGROUND

A phase-locked loop (PLL) is an electronic circuit that generates an output signal whose phase is related to the phase of an input signal. The phase-locked loop comprises a variable frequency oscillator, filter, and a phase detector. The oscillator generates a periodic signal. The phase detector compares the phase of that signal with the phase of the input periodic signal and adjusts the oscillator to keep the phases matched. Transmitting the output signal back toward the input signal for comparison is called a feedback loop since the output is "fed back" toward the input forming a loop. An all-digital PLL (ADPLL) uses digital (instead of analog) phase detector, filter and oscillator devices. All digital phase-locked loops are widely employed in radio, telecommunications, computers and other electronic applications to demodulate a signal, recover a signal from a noisy communication channel, generate a stable frequency at multiples of an input frequency (frequency synthesis), or distribute precisely timed clock pulses in digital logic circuits such as microprocessors.

A time-to-digital converter (TDC) is a key building block in all-digital PLL. It is used to measure and quantize a time interval between two input signals to the time-to-digital converter and convert the time interval into a digital (binary) output. The time-to-digital converter may adopt one or more delay lines, each comprising a plurality of delay cells connected in series and used to define the delay time by an input signal propagating through the delay line in the time-to-digital converter. For a time-to-digital converter, the delay cells can be tunable, i.e., the control voltage of the delay cells are controllable so that the timing resolution of the delay lines can be adjusted. Such tunable delay cells are useful for fin field effect transistors (FinFET) used in various different types of semiconductor devices.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

This disclosure describes a design for tunable delay cells for a compact and high performance time-to-digital converter. According to the design, each tunable delay cell is formed with a plurality of tunable delay units connected in series. Each tunable delay unit includes a tunable metal oxide semiconductor (MOS) transistor and a poly on oxide definition (OD) edge (PODE) transistor. As used herein, the term "oxide definition" refers to a dielectric structure that can be formed of an oxide or other suitable dielectric for active device fabrication. The tunable MOS and PODE transistor are merged with a core transistor in layout in order to achieve a small layout area and small corner variation for the delay cell. In addition, the tunable delay units are implemented in pairs of tunable PMOS transistor with a PODE transistor in one delay cell and a complementary tunable NMOS transistor with a PODE transistor in a separate delay cell to achieve a smooth C-V curve for the delay cells. The complementary delay cells are then used to from delay lines in a time-to-digital converter.

Figure 1A:
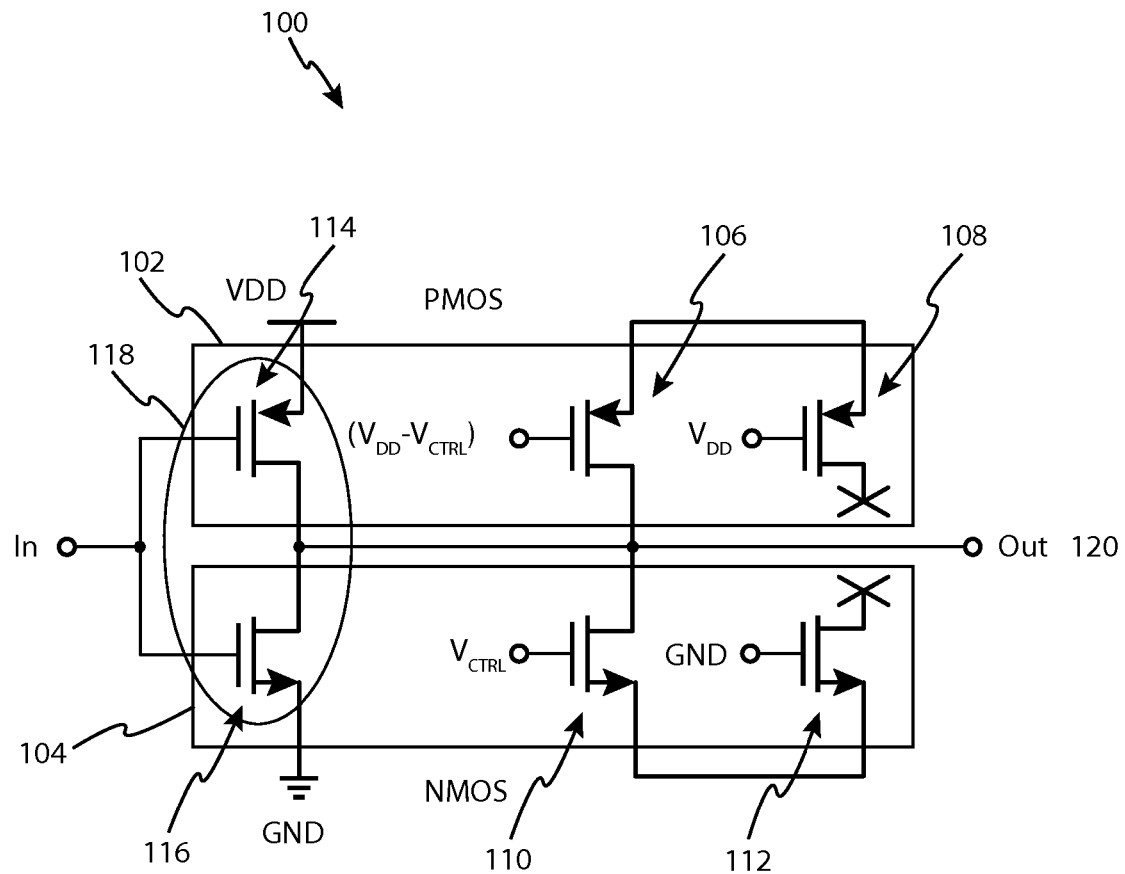
FIG. 1A illustrates a schematic view of an example of a pair of complementary tunable delay units, which includes a PMOS delay unit and an NMOS delay unit.

FIG. 1A illustrates a schematic view of an example of a device 100 comprising a pair of complementary tunable delay units, which includes PMOS delay unit 102 and NMOS delay unit 104. Here, PMOS delay unit 102 includes a tunable PMOS transistor 106 and a PODE transistor 108, wherein the PMOS transistor 106 and the PODE transistor 108 share the same source. The PMOS transistor 106 functions as a pull-up transistor in some embodiments, and its gate is coupled to a tunable voltage of VDD–Vctrl, where VDD is the high voltage source and Vctrl is the control voltage tunable to adjust the delay of signal propagating through the delay unit 102. The gate of the PODE transistor 108 is coupled to VDD and the PODE transistor 108 functions as an adjustable resistance and capacitance as part of the tunable delay unit 102.

As shown in FIG. 1A, the complementary NMOS delay unit 104 includes a tunable NMOS transistor 110 and a PODE transistor 112, wherein the NMOS transistor 110 and the PODE transistor 112 share the same source. The NMOS transistor 110 functions as a pull-down transistor in some embodiments, and its drain couples to the drain of PMOS transistor 106 at output node 120. The gate of the NMOS transistor 110 is coupled to the tunable voltage of Vctrl. As such, the adjustable control voltage Vctrl creates a DC gate bias between the gates of the tunable PMOS transistor 106 and the tunable NMOS transistor 110 to tune the delay of the signal propagating through the delay units 102 and 104. The gate of the PODE transistor 112 is coupled to the low voltage source GND and, similar to PODE transistor 108, PODE transistor 112 functions as an adjustable resistance and capacitance as part of the tunable delay unit 104.

As shown in FIG. 1A, the PMOS delay unit 102 and the NMOS delay unit 104 further includes a core PMOS transistor 114 and a core NMOS transistor 116, which form an inverter 118 for the input signal IN before the signal is propagated through the delay units. The PMOS transistor 114 of inverter 118 has its source coupled to high-voltage source VDD, and its drain coupled to node 120 that serves as the output of the inverter 118. NMOS transistor 116 of inverter 118 has its source coupled to low voltage source GND and its drain coupled to node 120. The gates of transistors 114 and 116 are coupled together at input signal IN, which serves as the input of inverter 118. During operation, the timing/delay of the output signal OUT from inverter 118 through delay units 102 and 104 can be tuned by adjusting the control voltage Vctrl that forms the DC gate bias at the gates of the tunable MOS transistors 106 and 110.

Figure 1B:
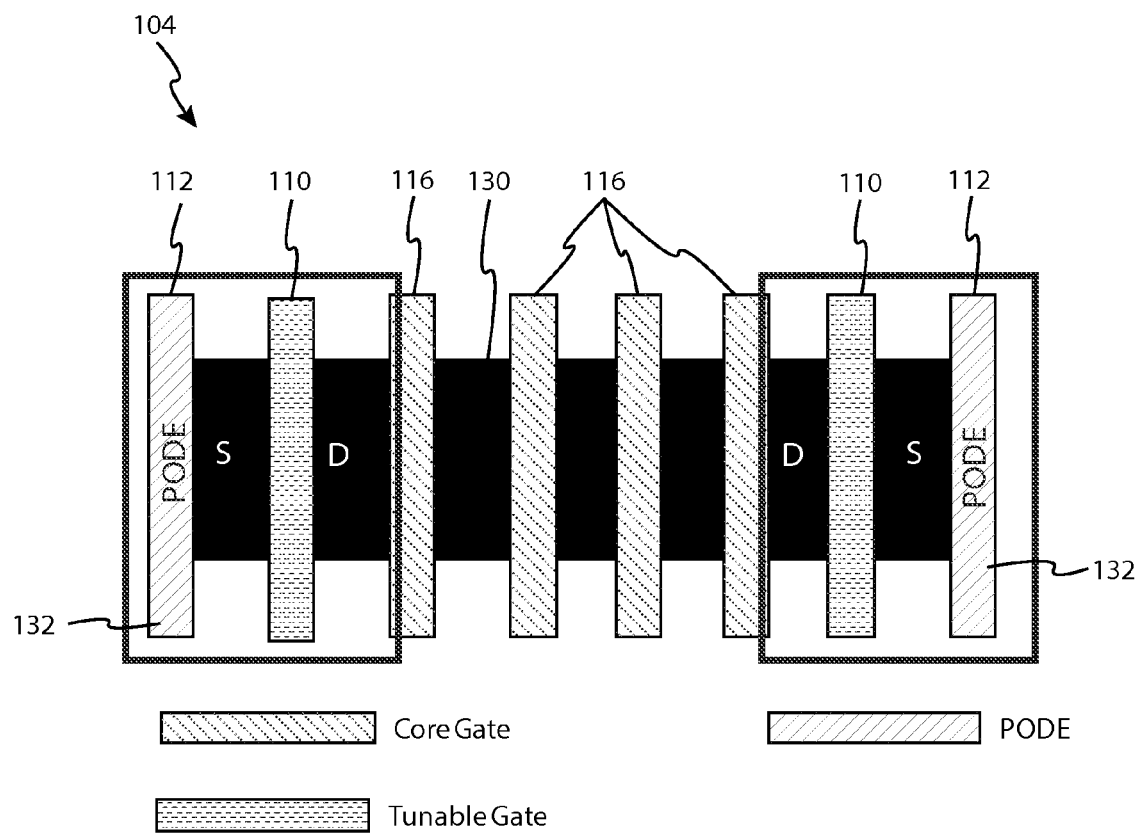
FIG. 1B shows an example of a plan view of the layout of the an example of the NMOS delay unit in FIG. 1A.

FIG. 1B shows an example of a plan view of the layout of the an example of the NMOS delay unit 104 in FIG. 1A (the layout for PMOS delay unit 102 is similar). Here, the tunable NMOS transistor 110 and PODE transistor 112 in the NMOS delay unit 104 are formed on the same oxide definition (OD) region 130 together with NMOS transistor 116 as well as other core transistors (not shown) in the circuit to reduce the layout area of the delay units and delay cells. As a result of using a shared OD region layout, the layout area of NMOS delay unit 104 can be significantly reduced compared to a layout where different OD regions are used for different transistors. As shown in FIG. 1B, NMOS transistor 110 shares the same source S with PODE transistor 112 and each of the tunable NMOS transistor 110. PODE transistor 112, and NMOS transistor 116 are placed in multiple portions/fingers, which are connected on a separate interconnect layer (by a combination of one or more contacts, vias and conductive lines, not shown). In some embodiments, PODE connection 132 of PODE transistor 112 is placed close to the edge of the OD region 130 as shown in FIG. 1B.

Figure 2:
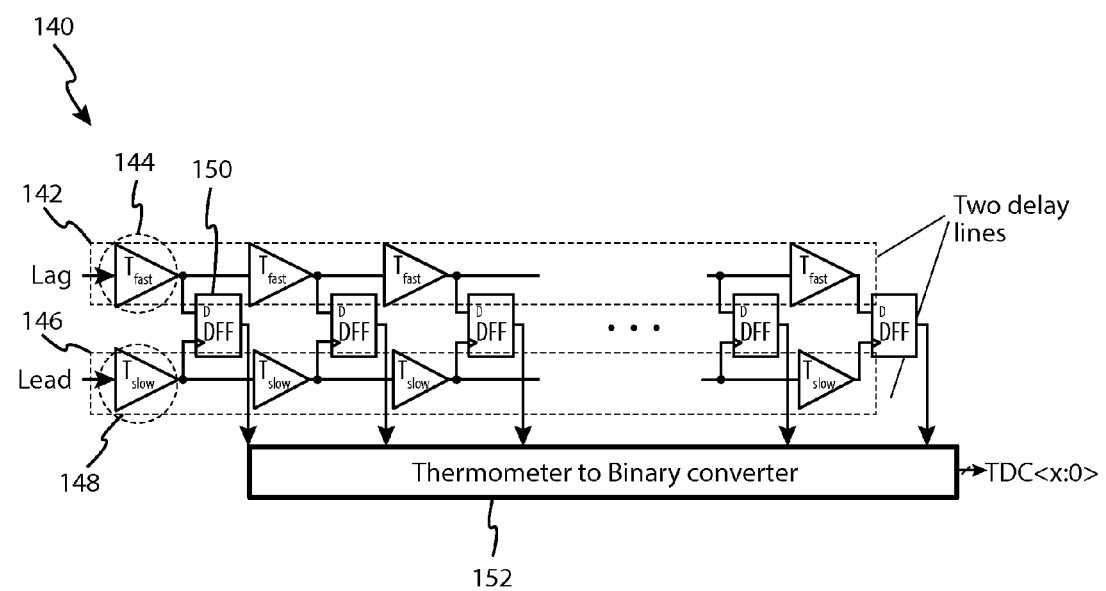
FIG. 2 illustrates an example of time-to-digital converter (TDC) that includes delay lines implemented using the delay units shown in FIGS. 1A and 1B.

FIG. 2 illustrates an example of time-to-digital converter (TDC) that includes delay lines implemented using the delay units shown in FIGS. 1A and 1B. As shown in FIG. 2, TDC 140 includes a pair of delay lines 142 and 146, a plurality of D flip-flops 150, and a thermometer to binary converter 152. The delay lines 142 and 146 each includes a plurality of delay cells 144 and 148, respectively, wherein each of the delay cells 144 and 148 includes a plurality of (for a non-limiting example, four) delay units (not shown) discussed above. The delay line 142 takes a signal lagging in time with respect to clock cycle as its input, and each delay cell 144 in the delay line 142 has a propagation delay of Tfast, which "speeds up" the lagging signal with the control voltage Vctrl tuned for reducing the propagation delay of the lagging signal through the delay line 142. The delay line 146, on the other hand, takes a signal leading in time with respect to clock cycle as its input, and each delay cell 148 in the delay line 146 has a propagation delay of Tslow, which "slows down" the leading signal with the control voltage Vctrl tuned for increasing the propagation delay of the leading signal through the delay line 146. Each D flip-flop 150 takes the output from a fast delay cell 144 as its input and the output from a corresponding slow delay cell 148 as its reference clock. The output from D flip-flop 150 reflects the (timing) resolution of the TDC 140, which is the time interval/difference Td between the propagated delays through the fast delay cell 144 and the slow delay cell 148, i.e., Td=Tslow−Tfast. The output signals from the D flip-flops 150 are then provided to thermometer to binary converter 152, which converts multiple value input (e.g., in the form of thermo code) from the D flip-flops 150 into a series of binary values as the output from the TDC 140.

Figure 3:
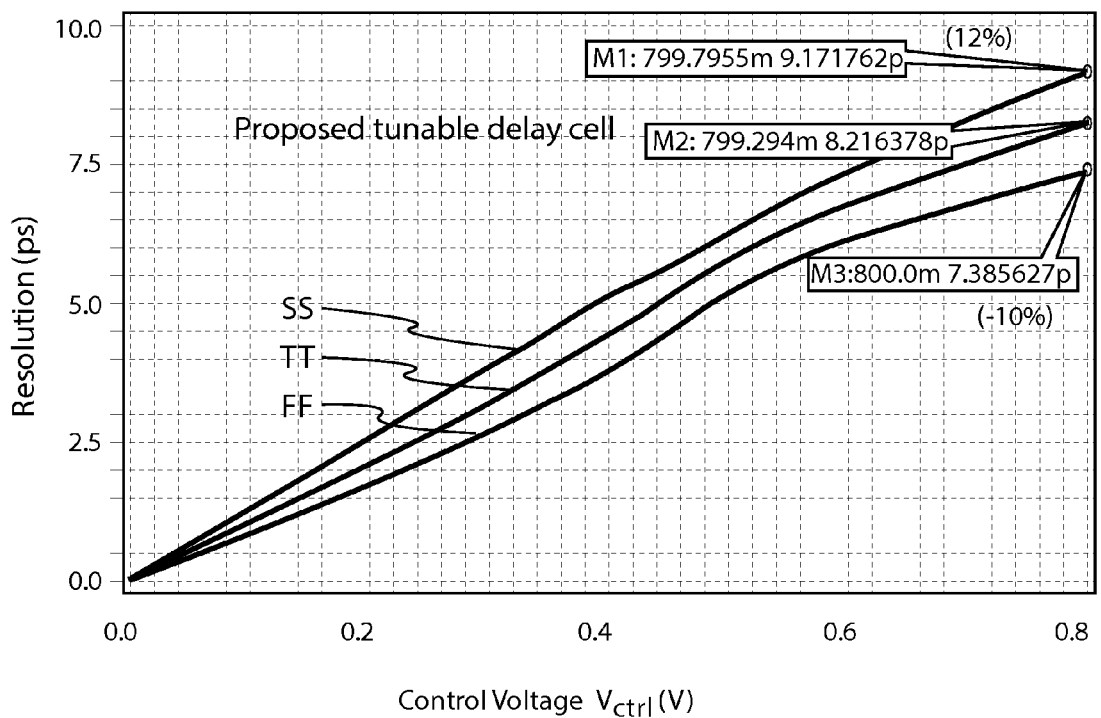
FIG. 3 shows examples of curves reflecting the relationship between the time resolution of the proposed delay cells and the control voltage used to tune the gate DC bias of the delay cells.

FIG. 3 shows examples of simulation curves reflecting the relationship between the time resolution measured in ps of the delay cells 144/148 of TDC 140 described above and the control voltage measured in Volt used to tune the gate DC bias of the delay cells. As shown in FIG. 3, delay cells 144 and 148 demonstrate a near linear resolution-to-controlled-voltage curve with gradual slopes, making it easy to calibrate the delay cells. Since the delay units 102, 104 in the delay cells 144 and 148 are formed and implemented together with core transistors 114, 116 on the same OD region as discussed above, the corner variations of the delay cells represented by lines marked as SS (slow), TT (typical), and FF (fast) and measured in terms of timing resolution is relatively small, e.g., within the range of (−10%, 12%) as shown by the example in FIG. 3. Here corner variation refers to mobility variations caused by process variations for chips placed at different locations on the same wafer or on different wafers.

Figure 4:
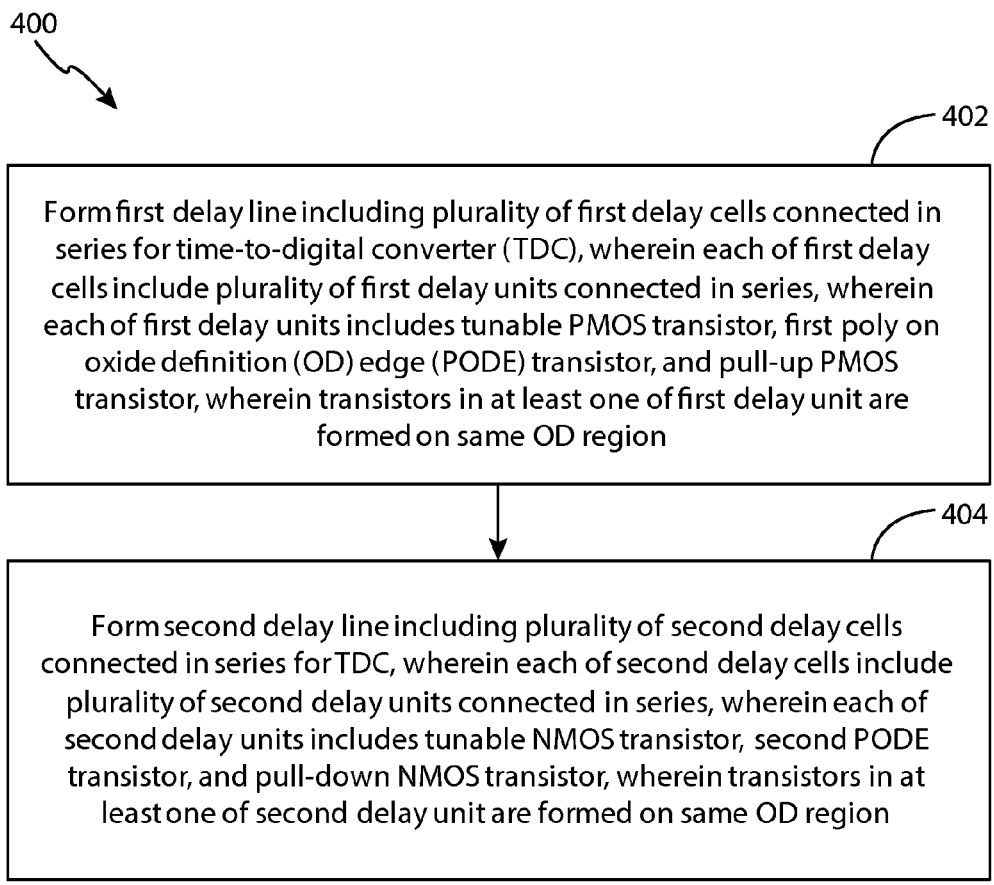
FIG. 4 is an example of a flow chart of a method for forming tunable delay cells for time-to-digital convertor, wherein the delay units are implemented in complementary PMOS and CMOS pairs with PODE transistors together with other core transistors on the same oxide definition (OD) region.

FIG. 4 is an example of a flow chart 400 of a method for forming tunable delay cells for time-to-digital convertor, wherein the delay units are implemented in complementary PMOS and CMOS pairs with PODE transistors together with other core transistors on the same OD region.

At step 402, a first delay line including a plurality of first delay cells connected in series is formed for a time-to-digital converter (TDC), wherein each of the first delay cells include a plurality of first delay units connected in series, wherein each of the first delay units includes a tunable PMOS transistor, a first poly on oxide definition (OD) edge (PODE) transistor, and a pull-up PMOS transistor, wherein the transistors in at least one of the first delay unit are formed on a same OD region.

At step 404, a second delay line including a plurality of second delay cells connected in series is formed for the TDC, wherein each of the second delay cells include a plurality of second delay units connected in series, wherein each of the second delay units includes a tunable NMOS transistor, a second PODE transistor, and a pull-down NMOS transistor, wherein the transistors in at least one of the second delay unit are formed on a same OD region.

With the tunable delay cells described above, the resolution-to-controlled-voltage curve of the delay cells 144, 148 is smooth with gradual slope for calibration. In addition, the corner variation is small and the layout area of the delay cells 144, 148 is effectively reduced due to the implementation of the delay cells together with core transistors of the device on the same OD region in layout. Since the delay cells are implemented in complementary pairs of PMOS and CMOS transistors, the C-V curve (i.e., control voltage over the capacitance) of the of the delay cells also becomes smooth.

In some embodiments, a time-to-digital converter (TDC) comprises a first delay line including a plurality of first delay cells connected in series, wherein each of the first delay cells include a plurality of first delay units connected in series, wherein each of the first delay units includes a tunable PMOS transistor, a first poly on oxide definition (OD) edge (PODE) transistor, and a pull-up PMOS transistor. The TDC further comprises a second delay line including a plurality of second delay cells connected in series, wherein each of the second delay cells include a plurality of second delay units connected in series, wherein each of the second delay units includes a tunable NMOS transistor, a second PODE transistor, and a pull-down NMOS transistor.

In some embodiments, the TDC further comprises a plurality of D flip-flops each receiving an output from a first delay cell in the first delay line and a second delay cell in the second delay line to determine a timing resolution of the delay cells.

In some embodiments, the TDC further comprises a thermometer to binary converter, which converts a multiple value input from the plurality of D flip-flops into a series of binary values as output from the TDC.

In some embodiments, at least one of the first delay units and at least one of second delay units is implemented on a same oxide definition (OD) region.

In some embodiments, a gate of the tunable PMOS transistor in at least one of the first delay units is coupled to a difference between a high voltage source and a control voltage.

In some embodiments, a gate of the first PODE transistor in at least one of the first delay units is coupled to a high voltage source.

In some embodiments, the tunable PMOS transistor and the first PODE transistor in at least one of the first delay units share the same source.

In some embodiments, a gate of the tunable NMOS transistor in at least one of the second delay units is coupled to the control voltage.

In some embodiments, a gate of the second PODE transistor in at least one of the second delay units is coupled to a low voltage source.

In some embodiments, the tunable NMOS transistor and the second PODE transistor in at least one of the second delay units share the same source.

In some embodiments, a delay unit structure comprises a first delay unit that includes a tunable PMOS transistor, a first poly on oxide definition (OD) edge (PODE) transistor, and a pull-up PMOS transistor, wherein the tunable PMOS transistor and the first PODE transistor share a same source as each other. The delay unit structure further comprises a second delay unit that includes a tunable NMOS transistor, a second PODE transistor, and a pull-down PMOS transistor, wherein the tunable NMOS transistor and the second PODE transistor share a same source as each other. The gates of the first and the second delay units are each coupled to an adjustable voltage source to provide a DC bias on the gates of the delay units.

In some embodiments, a method for forming a time-to-digital converter (TDC) comprises forming a first delay line including a plurality of first delay cells connected in series, wherein each of the first delay cells include a plurality of first delay units connected in series, wherein each of the first delay units includes a tunable PMOS transistor, a first poly on oxide definition (OD) edge (PODE) transistor, and a pull-up PMOS transistor. The method further comprises forming a second delay line including a plurality of second delay cells connected in series, wherein each of the second delay cells include a plurality of second delay units connected in series, wherein each of the second delay units includes a tunable NMOS transistor, a second PODE transistor, and a pull-down NMOS transistor.

In some embodiments, the method further comprises forming a plurality of D flip-flops each receiving an output from a first delay cell in the first delay line and a second delay cell in the second delay line to determine a timing resolution of the delay cells. The method further comprises forming a thermometer to binary converter, which converts a multiple value input from the plurality of D flip-flops into a series of binary values as output from the TDC.

In some embodiments, the method further comprises implementing at least one of the first delay units and at least one of the second delay units on a same oxide definition (OD) region.

In some embodiments, the method further comprises coupling a gate of the tunable PMOS transistor in at least one of the first delay units to a difference between a high voltage source and a control voltage.

In some embodiments, the method further comprises coupling a gate of the first PODE transistor in at least one of the first delay units to a high voltage source.

In some embodiments, the method further comprises enabling the tunable PMOS transistor and the first PODE transistor in at least one of the first delay units to share the same source.

In some embodiments, the method further comprises coupling a gate of the tunable NMOS transistor in at least one of the second delay units to the control voltage.

In some embodiments, the method further comprises coupling a gate of the second PODE transistor in at least one of the second delay units to a low voltage source.

In some embodiments, the method further comprises enabling the tunable NMOS transistor and the second PODE transistor in at least one of the second delay units to share the same source.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

We claim:

1. A time-to-digital converter (TDC), comprising:
a first delay line including a plurality of first delay cells connected in series, wherein each of the first delay cells include a plurality of first delay units connected in series, wherein each of the first delay units includes a tunable PMOS transistor, a first poly on oxide definition (OD) edge (PODE) transistor, and a pull-up PMOS transistor;
a second delay line including a plurality of second delay cells connected in series, wherein each of the second delay cells include a plurality of second delay units connected in series, wherein each of the second delay units includes a tunable NMOS transistor, a second PODE transistor, and a pull-down NMOS transistor;
at least one of the first delay units and at least one of the second delay units is implemented on a same oxide definition (OD) region.

2. The TDC of claim 1, further comprising:
a plurality of D flip-flops each receiving an output from a first delay cell in the first delay line and a second delay cell in the second delay line to determine a timing resolution of the delay cells.

3. The TDC of claim 2, further comprising:
a thermometer to binary converter, which converts a multiple value input from the plurality of D flip-flops into a series of binary values as output from the TDC.

4. The TDC of claim 1, wherein:
a gate of the tunable PMOS transistor in at least one of the first delay units is coupled to a difference between a high voltage source and a control voltage.

5. The TDC of claim 1, wherein:
a gate of the first PODE transistor in at least one of the first delay units is coupled to a high voltage source.

6. The TDC of claim 1, wherein:
the tunable PMOS transistor and the first PODE transistor in at least one of the first delay units share the same source.

7. The TDC of claim 1, wherein:
a gate of the tunable NMOS transistor in at least one of the second delay units is coupled to a control voltage.

8. The TDC of claim 1, wherein:
a gate of the second PODE transistor in at least one of the second delay units is coupled to a low voltage source.

9. The TDC of claim 1, wherein:
the tunable NMOS transistor and the second PODE transistor in at least one of the second delay units share the same source.

10. A delay unit structure, comprising:
  a first delay unit that includes a tunable PMOS transistor, a first poly on oxide definition (OD) edge (PODE) transistor, and a pull-up PMOS transistor, wherein the tunable PMOS transistor and the first PODE transistor share a same source as each other;
  a second delay unit that includes a tunable NMOS transistor, a second PODE transistor, and a pull-down PMOS transistor, wherein the tunable NMOS transistor and the second PODE transistor share a same source as each other;
  wherein gates of the first and the second delay units are each coupled to an adjustable voltage source to provide a DC bias on the gates of the delay units.

11. A method for forming a time-to-digital converter (TDC), comprising:
  forming a first delay line including a plurality of first delay cells connected in series, wherein each of the first delay cells include a plurality of first delay units connected in series, wherein each of the first delay units includes a tunable PMOS transistor, a first poly on oxide definition (OD) edge (PODE) transistor, and a pull-up PMOS transistor;
  forming a second delay line including a plurality of second delay cells connected in series, wherein each of the second delay cells include a plurality of second delay units connected in series, wherein each of the second delay units includes a tunable NMOS transistor, a second PODE transistor, and a pull-down NMOS transistor;
  implementing at least one of the first delay units and at least one of the second delay units on a same oxide definition (OD) region.

12. The method of claim 11, further comprising:
  forming a plurality of D flip-flops each receiving an output from a first delay cell in the first delay line and a second delay cell in the second delay line to determine a timing resolution of the delay cells;
  forming a thermometer to binary converter, which converts a multiple value input from the plurality of D flip-flops into a series of binary values as output from the TDC.

13. The method of claim 11, further comprising:
  coupling a gate of the tunable PMOS transistor in at least one of the first delay units to a difference between a high voltage source and a control voltage.

14. The method of claim 11, further comprising:
  coupling a gate of the first PODE transistor in at least one of the first delay units to a high voltage source.

15. The method of claim 11, further comprising:
  enabling the tunable PMOS transistor and the first PODE transistor in at least one of the first delay units to share the same source.

16. The method of claim 11, further comprising:
  coupling a gate of the tunable NMOS transistor in at least one of the second delay units to the control voltage.

17. The method of claim 11, further comprising:
  coupling a gate of the second PODE transistor in at least one of the second delay units to a low voltage source.

18. The method of claim 11, further comprising:
  enabling the tunable NMOS transistor and the second PODE transistor in at least one of the second delay units to share the same source.

* * * * *